United States Patent
Lee et al.

(10) Patent No.: US 8,432,196 B2
(45) Date of Patent: Apr. 30, 2013

(54) METHOD AND APPARATUS OF RESETTING MOBILE DEVICE

(75) Inventors: Woo Cheol Lee, Suwon-si (KR); Tae Young Ha, Sungnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 6 days.

(21) Appl. No.: 13/206,115

(22) Filed: Aug. 9, 2011

(65) Prior Publication Data

US 2012/0038397 A1 Feb. 16, 2012

(30) Foreign Application Priority Data

Aug. 10, 2010 (KR) .......................... 10-2010-0076677
Mar. 15, 2011 (KR) .......................... 10-2011-0022950

(51) Int. Cl.
  *H03L 7/00* (2006.01)
(52) U.S. Cl.
  USPC ............................. 327/142; 327/143; 327/198
(58) Field of Classification Search .................. 327/142, 327/143, 198
  See application file for complete search history.

(56) References Cited

U.S. PATENT DOCUMENTS

| 7,573,152 | B2 * | 8/2009 | Jacob et al. | 307/19 |
| 7,770,044 | B2 * | 8/2010 | Bibikar et al. | 713/330 |
| 7,814,485 | B2 * | 10/2010 | Morgan et al. | 718/100 |
| 2006/0123252 | A1 * | 6/2006 | Vaidya et al. | 713/300 |
| 2008/0024108 | A1 * | 1/2008 | Jacob et al. | 323/349 |
| 2012/0213135 | A1 * | 8/2012 | Woo et al. | 370/311 |

* cited by examiner

*Primary Examiner* — Lincoln Donovan
*Assistant Examiner* — Brandon S Cole
(74) *Attorney, Agent, or Firm* — Jefferson IP Law, LLP

(57) ABSTRACT

A method and apparatus of resetting a mobile device including a Power Management Integrated Circuit (PMIC) with no manual reset function are provided. The apparatus includes an input unit for creating a specific input signal for a reset according to a user's input. The apparatus includes a reset unit for creating a manual reset input signal in response to the specific input signal, and for blocking battery power supplied to the PMIC by using the manual reset input signal and a signal created during operations of the mobile device. The reset apparatus includes a power unit for supplying the battery power.

20 Claims, 12 Drawing Sheets

METHOD AND APPARATUS OF RESETTING MOBILE DEVICE

PRIORITY

This application claims the benefit under 35 U.S.C. §119 (a) of a Korean patent application filed on Aug. 10, 2010 in the Korean Intellectual Property Office and assigned Serial No. 10-2010-0076677, and a Korean patent application filed on Mar. 15, 2011 in the Korean Intellectual Property Office and assigned Serial No. 10-2011-0022950, the entire disclosure of each of which is hereby incorporated by reference.

BACKGROUND OF THE INVENTION

1. Field of the Invention

The present invention relates to a reset function of a mobile device. More particularly, the present invention relates to a method and apparatus of performing a manual reset function by controlling a Power Management Integrated Circuit (PMIC) that does not allow a manual reset function.

2. Description of the Related Art

With the advancement of communication technologies, a great variety of mobile devices are becoming increasingly popularized. According to a trend toward mobile convergence, recent mobile devices have various optional useful functions and applications as well as their traditional and essential functions. For instance, in addition to traditional functions such as a voice call and a short message service, other various functions are realized to enjoy or use broadcasts, music, games, a camera, the Internet, a dictionary, etc. in a mobile communication device.

Additionally, recent mobile devices are using advanced forms of hardware and software in order to support their various functions. Namely, a typical mobile device may execute various applications, based on hardware with higher processing capability.

However, even though hardware has appropriate specifications and corresponding software is designed adequately, it is extremely difficult to optimize them in consideration of numerous variables occurring in operating conditions. Namely, any high performance mobile device will have a possibility of unexpected errors. If such an error happens during a manufacturing process of a mobile device, a manufacturer or a designer may correct it. However, after a mobile device is manufactured or sold, feasible error correction efforts by a manufacturer or a designer may be greatly restricted. To address this problem, a mobile device includes a reset function.

Sometimes a reset function of the mobile device may be not available according to hardware specifications. This is because a mobile device may have some components that disallow a manual reset function. Therefore, a mobile device capable of performing a proper reset function at any time regardless of specific components is desired.

SUMMARY OF THE INVENTION

Aspects of the present invention are to address at least the above-mentioned problems and/or disadvantages and to provide at least the advantages described below.

An aspect of the present invention is to provide a mobile device including a Power Management Integrated Circuit (PMIC) to be able to perform a reset function.

Another aspect of the present invention is to prevent a leakage current when supporting a reset function of a PMIC having no manual reset function.

Still another aspect of the present invention is to provide a stable operation of a mobile device even in low temperature conditions when supporting a reset function of a PMIC having no manual reset function.

According to an aspect of the present invention, an apparatus of resetting a mobile device having a PMIC with no manual reset function is provided. The apparatus includes an input unit configured to create a specific input signal for a reset according to a user's input, a reset unit configured to create a manual reset input signal in response to the specific input signal, and to block battery power supplied to the PMIC by using the manual reset input signal and a signal created during operations of the mobile device, and a power unit configured to supply the battery power.

According to another aspect of the present invention, a method of resetting a mobile device having a PMIC with no manual reset function is provided. The method includes creating a manual reset input signal at a reset circuit in response to a specific input signal for a reset of the mobile device and then supplying the manual reset input signal to a reset control circuit, and controlling a state for supplying or blocking battery power to the PMIC on a basis of the reset control circuit receiving the manual reset input signal when the specific input signal and a signal created during operations of the mobile device occur.

Therefore, according to the above method and apparatus, a user of the mobile device having no manual reset function can conduct a reset function through a specific signal input.

Additionally, according to the above method and apparatus, a leakage current may be prevented when a reset function is supported, and a reset function may be stably performed even in specific temperature conditions.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
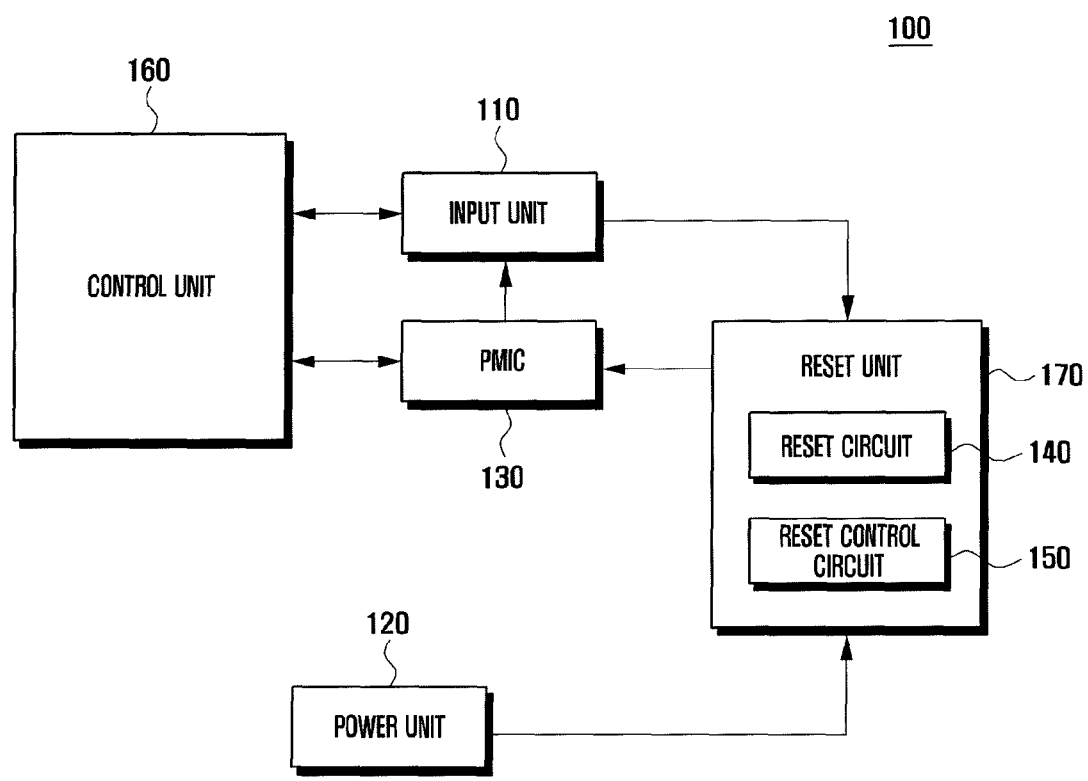
FIG. 1 is a block diagram illustrating the configuration of a mobile device in accordance with an exemplary embodiment of the present invention.

FIG. 1 is a block diagram illustrating elements related to a reset function in a mobile device in accordance with an exemplary embodiment of the present invention.

Referring to FIG. 1, a mobile device 100 includes an input unit 110, a power unit 120, a Power Management Integrated Circuit (PMIC) 130, a reset unit 170, and a control unit 160. More particularly, the reset unit 170 may have a reset circuit 140, a reset control circuit 150, and any other circuitry.

The mobile device 100 supports a reset function by blocking or resuming a supply of electric power for the PMIC 130 according to a specific input signal created by the input unit 110. Particularly, using the reset control circuit 150 disposed between the PMIC 130 and the power unit 120, the mobile device 100 controls a reset of the PMIC 130. Now, each of the above elements will be fully described hereinafter.

The input unit 110 is configured to create a variety of input signals required for operations of the mobile device 100. The input unit 110 may be formed of at least one of a plurality of key buttons, a keypad, a touch pad, and a touch screen. Exemplarily used in this disclosure is the input unit 110 including a plurality of key buttons. When a user presses a selected key button, the input unit 110 may create a specific input signal. This input signal may be delivered to all of the control unit 160, the reset circuit 140 and the reset control circuit 150. Especially, an input signal delivered to both the reset circuit 140 and the reset control circuit 150 may correspond to a specific key button. For instance, an input signal delivered to both the reset circuit 140 and the reset control circuit 150 may be a combination of a signal created when a power key button used for turning on or off the mobile device 100 is selected and a signal created when at least one of any other key buttons is selected. In this case, a user of the mobile device 100 may simultaneously press a power key button and any other specific key button in the input unit 110 so as to activate a manual reset function. The above case is exemplary only and not to be considered as a limitation of this invention. This input signal for activating a manual reset function may be created using any other selections or combination of key buttons according to various designs for input signal creation algorithm. In addition to or instead of key buttons, any other input means such as a touch pad, a touch screen or side keys may also be used to create an input signal for activating a manual reset function. It will be therefore understood by those skilled in the art that an input signal created using a power key button and any specific key button is merely one of various possible input signals to be assigned for a manual reset function.

The power unit 120 is configured to supply electric power to the mobile device 100. The power unit 120 may be designed in a built-in form or in a detachable form. In the latter case, the mobile device 100 may have a space large enough to accommodate the power unit 120 and may further have signal lines for connections with the power unit 120. The power unit 120 may be formed of a rechargeable secondary battery as well as a primary battery. The power unit 120 may supply electric power required for driving the mobile device 100 to the PMIC 130 through the reset control circuit 150. Namely, under the control of the reset control circuit 150, power supplied from the power unit 120 may be successively offered to the PMIC 130 or blocked.

The PMIC 130 is configured to create various types of power suitable for operations of respective elements of the mobile device 100 through conversion of power received from the power unit 120. Specifically, the PMIC 130 may create power to be optimized for operations of the control unit 160, the input unit 110, and any other modules of the mobile device 100 such as a camera module, an MP3 module, a radio frequency module, or the like. Since the PMIC 130 creates power by conversion required for each individual element of the mobile device 100, a size of the supplied power, e.g., a voltage value, delivered to each element may be varied. More particularly, the PMIC 130 may keep the mobile device 100 in a turn-off state when failing to receive power from the power unit 120, and may keep the mobile device 100 in a turn-on state when receiving power from the power unit 120. Moreover, the PMIC 130 may support a manual reset function of the mobile device 100 by changing a turn-off state to a turn-on state under the control of the reset control circuit 150. The PMIC 130 may not support a manual reset function by itself without depending on the reset control circuit 150.

The reset circuit 140 is disposed between the input unit 110 and the reset control circuit 150. The reset circuit 140 is configured to create a reset command in response to a reset input signal received from the input unit 110 and to deliver the reset command to the reset control circuit 150. The reset circuit 140 may be designed in a form of a chip in which an input terminal is connected to the input unit 110 and an output terminal is connected to the reset control circuit 150. Detailed configuration and operation of the reset circuit 140 will be described below.

The reset control circuit 150 is disposed between the reset circuit 140 and the power unit 120 and between the power unit 120 and the PMIC 130. The reset control circuit 150 is configured to receive power from the power unit 120 and then, depending on an output of the reset circuit 140, to allow or disallow power to be delivered to the PMIC 130. The reset control circuit 150 may be designed to continuously deliver power to the PMIC 130 from the power unit 120 when driving the mobile device 100. If an input signal for activating a reset function is received from the input unit 110, the reset control circuit 150 may support a reset of the mobile device 100 by temporarily blocking or resuming the supply of power for the PMIC 130. In order to resume the supply of power, the reset control circuit 150 may have a counter, or may use the output of a separate counter provided in the mobile device 100. Detailed configuration and operation of the reset control circuit 150 will be described below.

The control unit 160 controls the delivery of power with various types and sizes from the PMIC 130 to respective elements of the mobile device 100. Additionally, while the mobile device 100 operates, the control unit 160 may receive a variety of input signals from the input unit 110 and, in response to the received signals, control operations of currently activated applications. Since the control unit 160 is separately disposed from the reset circuit 140 and the reset control circuit 150, the control unit 160 may operate independently from a manual reset function. Even so, the control unit 160 should receive power from the PMIC 130 in order to perform necessary functions for driving the mobile device 100. Therefore, if the reset control circuit 150 blocks the supply of power from the power unit 120 to the PMIC 130, the control unit 160 may also stop operating. In an exemplary embodiment of the present invention, for a resumption of power supplied to the PMIC 130, the control unit 160 may offer an output of a counter to the reset control circuit 150. This counter may be designed to run ceaselessly even though the supply of power is temporarily stopped from the power unit 120, and may be provided separately from the control unit 160 in the mobile device 100.

As discussed heretofore, the mobile device 100 according to an embodiment of this invention may dispose the reset circuit 140 and the reset control circuit 150 among the input unit 110, the PMIC 130, and the power unit 120 and may support a manual reset function by blocking the supply of power for the PMIC 130 in response to an input signal received from the input unit 110. Now, detailed configurations of the reset circuit 140 and the reset control circuit 150 will be described hereinafter.

Figure 2:
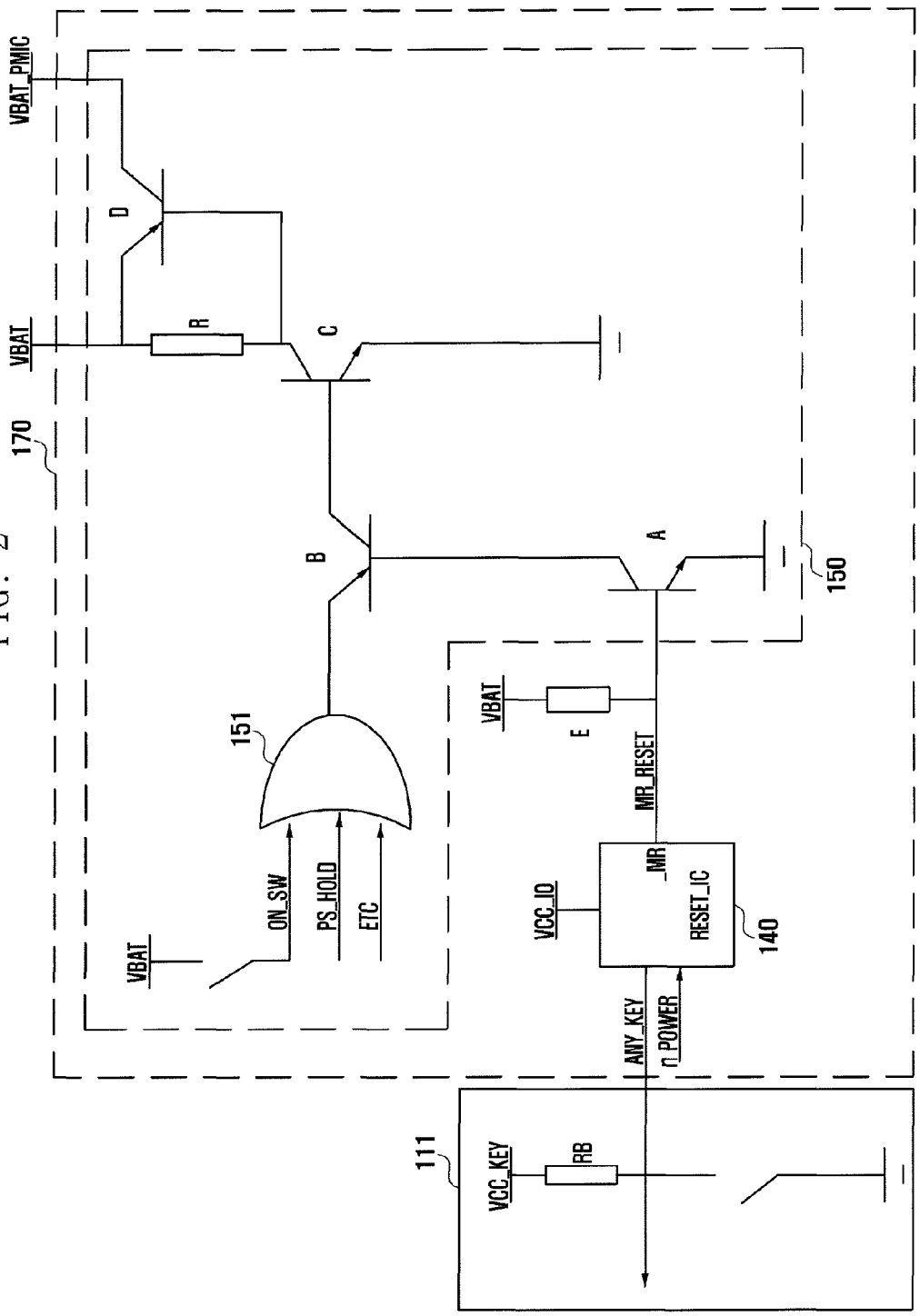
FIG. 2 is a circuit diagram illustrating a reset unit of a mobile device in accordance with a first exemplary embodiment of the present invention.

FIG. 2 is a circuit diagram illustrating a reset unit of a mobile device in accordance with a first exemplary embodiment of the present invention.

Referring to FIG. 2, the reset unit 170 includes the reset circuit 140 and the reset control circuit 150. When an input signal for a manual reset is offered to the reset circuit 140 and the reset control circuit 150 from the input unit 110, the reset circuit 140 may supply a manual reset signal MR_RESET to the reset control circuit 150 such that the reset control circuit 150 may block the supply of power from the power unit 120 to the PMIC 130. Therefore, the reset unit 170 may support a manual reset function by stopping the supply of power to the control unit 160 and thereby putting the mobile device 100 in a turn-off state. Now, circuit configuration and operation of the reset unit 170 will be described in detail hereinafter.

The input port of the reset circuit 140 in the reset unit 170 is connected to a key input circuit 111 of the input unit 110, and the reset control circuit 150 is disposed at the output port of the reset circuit 170. The reset control circuit 150 may have a first switch A, a second switch B, an OR gate 151, a third switch C, and a fourth switch D. The output of the reset circuit 140 is delivered to the first switch A. The activation of the second switch B is determined depending on whether the first switch A is activated. The OR gate 151, also referred to as an OR-ING circuit, delivers one of specific signals created in the mobile device 100 to the second switch B. The third switch C receives a specific signal depending on the activation of the second switch B and operates based on the received signal. The fourth switch D controls supplying battery power VBAT to the PMIC 130 depending on an activation of the third switch C. One end of the fourth switch D may be connected to the power unit 120, and the other end may be connected to the PMIC 130. Therefore, the fourth switch D may operate depending on the state of the third switch C, so that battery power VBAT of the power unit 120 may be supplied or not to the PMIC 130. The reason that the input port of the reset control circuit 150 is formed of the OR gate 151 is to allow various power-on events such as the insertion of a charger or the insertion of a Universal Serial Bus (USB) jig to be treated the same as the occurrence of an ON-SW signal. Here, the occurrence of the ON-SW signal means that a switch for the supply of power operates in response to a power key input signal or the like. In order to output the manual reset signal MR_RESET of the reset circuit 140 as a logical low signal, the power key input signal nPower may use an inverse signal of a power key input signal. Among inputs of the OR gate 151, the PS_HOLD signal is a signal for offering a continuous high-state signal when the mobile device 100 operates. Namely, since the PS_HOLD signal indicates that the supply of power is maintained, the PS_HOLD signal offers a high-state signal while the mobile device 100 operates. The ETC signal means any other signals such as the insertion of a charger or USB jig or the output of a counter. In an exemplary embodiment of the present invention, the first switch A and the third switch C may be formed of NPN-type transistors and the second switch B and the fourth switch D may be formed of PNP-type transistors. However, the present invention is not limited to the above switch type and any other various types of switch may be used.

Additionally, input/output power VCC_IO is supplied for driving the reset circuit 140. For input/output of the mobile device 100, the battery power VBAT received by the PMIC 130 from the power unit 120 may be converted into input/output power VCC_IO. Furthermore, the reset unit 170 includes a pull-up resistor E connected in parallel between the reset circuit 140 and the first switch A. One end of the pull-up resistor E is connected to the power unit 120.

In an exemplary embodiment of the present invention, if there is built-in resistance in the first switch A, an electric current may not flow through the first switch A due to a small voltage between the base and the emitter of the first switch A and thereby electric power may not be offered to the mobile device 100. It is therefore desirable that a value of the pull-up resistor E is less than 10% of built-in resistance of the first switch A. Here, the value of the pull-up resistor E may vary according to the presence and size of built-in resistance of the first switch A.

The reset unit 170 is configured to allow a manual reset input signal, i.e., a power key input signal nPower, created by the key input circuit 111 and a specific key input signal ANY_KEY to be delivered to the reset circuit 140. Here, the key input circuit 111 allows key power VCC_KEY to be supplied to the input unit 110 and may have button resistors RB connected to respective key buttons. Additionally, the output port of the reset circuit 140 is connected to the base of the first switch A, and both the pull-up resistor E and battery power VBAT may be connected in parallel between the output port of the reset circuit 140 and the base of the first switch A. Therefore, if there is no output of the reset circuit 140, the battery power VBAT is supplied as default value to the base of the first switch A and allows the first switch A to keep a turn-on state. When the first switch A is in a turn-on state, the second switch B that is different from the first switch A in characteristics may allow the output of the OR gate 151 to be delivered to the base of the third switch C. Then the third switch C enters into an activated state by the output of the OR gate 151, so that the fourth switch D connected to the collector of the third switch C supplies the battery power VBAT to the PMIC 130. Therefore, while the manual reset signal MR_RESET is not supplied to the base of the first switch A at the output port of the reset circuit 140, the battery power VBAT is continuously supplied to the PMIC 130. Then the PMIC 130 may convert the battery power VBAT into various types of power required for driving the mobile device 100 and offer it to respective elements of the mobile device 100. Additionally, when the key power VCC_KEY offered by the PMIC 130 is supplied to the input unit 110, the input/output power VCC_IO is supplied to the reset circuit 140.

In an exemplary embodiment of the present invention, when the power key input signal nPower and the specific key input signal ANY_KEY are input from the input unit 110, the reset circuit 140 may deliver the manual reset signal MR_RESET having a logical low signal form to the base of the first switch A. Since the pull-up resistor E is connected in parallel to a signal line for delivering the manual reset signal MR_RESET and also the battery power VBAT is connected to one end of the pull-up resistor E, the battery power VBAT is supplied to the base of the first switch A while no manual reset signal MR_RESET with a low state occurs, and the first switch A remains in a turn-on state. If the manual reset signal MR_RESET is supplied to the base of the first switch A, the first switch A enters into an inactivated state, i.e., a turn-off state, and the second switch B performs a function to block the flow of current. Then the output of the OR gate 151 is not passed through the second switch B, so that the third switch C may enter into an inactivated state. When the third switch C is inactivated, the fourth switch D connected to the third switch C is also inactivated and the battery power VBAT is not supplied to the PMIC 130. In an exemplary embodiment of the present invention, a load resistor R is connected between the battery power VBAT and the collector of the third switch C such that the fourth switch D may supply the battery power VBAT to the PMIC 130 when the third switch C is activated.

If the supply of power for the PMIC 130 is temporarily stopped, the PMIC 130 stops the supply of the input/output power VCC_IO and the key power VCC_KEY. Namely, the supply of the input/output power VCC_IO for driving the reset circuit 140 is stopped. Therefore, the reset circuit 140 may not create any separate output signal. In an exemplary embodiment of the present invention, if a battery is still connected to the mobile device 100, the first switch A may be changed again to an activated state through the battery power VBAT and the pull-up resistor E. Also, by connecting the output of a separate counter for supporting a manual reset function to the OR gate 151 and by activating the third switch C through the second switch B, the battery power VBAT may be delivered to the PMIC 130 after counting of the counter, and the supply of power for the mobile device 100 may be resumed. Here, the separate counter may use one of various counters provided in the mobile device 100 or be separately assigned to the input of the OR gate 151 to create an input signal after the lapse of given time. Namely, a counter may be designed for counting a predetermined time after the occurrence of the specific key input signal ANY_KEY and the power key input signal nPower. By offering the non-inverse signal ON_SW of a power key input signal to the OR gate 151, the second switch B is activated and then the supply of power may be resumed. In an exemplary embodiment of the present invention, the battery power VBAT is a power source of the PMIC 130 and may be used as VBAT-PMIC power that is an input source of PMIC BUCK converter and Low Drop Out (LDO). Additionally, the power key input signal nPower may be an inverse signal converted according to an Input/Output (IO) level of the mobile device by the PMIC 130 receiving the ON_SW signal. Therefore, a low input of the power key input signal nPower and a low input of the specific key input signal ANY_KEY are supplied to the reset circuit 140, and then the reset circuit 140 supplies a low output to the base of the first switch A.

As discussed heretofore, the reset unit 170 according to an exemplary embodiment of the present invention may perform a reset function of the mobile device 100 by blocking the supply of power for the PMIC 130 failing to support a manual reset function. Also, the reset unit 170 may allow the battery power VBAT to be supplied to the PMIC 130 until an input signal for a manual reset is created using the battery power VBAT and the pull-up resistor E, and may support a default voltage for the mobile device 100 to be changed to a turn-on state from a turn-off state.

In an exemplary embodiment of the present invention, in the reset unit 170 having the above-discussed circuit configurations, a leakage current may be caused due to a potential difference between the battery power VBAT of the pull-up resistor E and the input/output power VCC_IO used for driving the reset circuit 140. In order to solve this problem, the following circuit configurations may be available.

Figure 3:
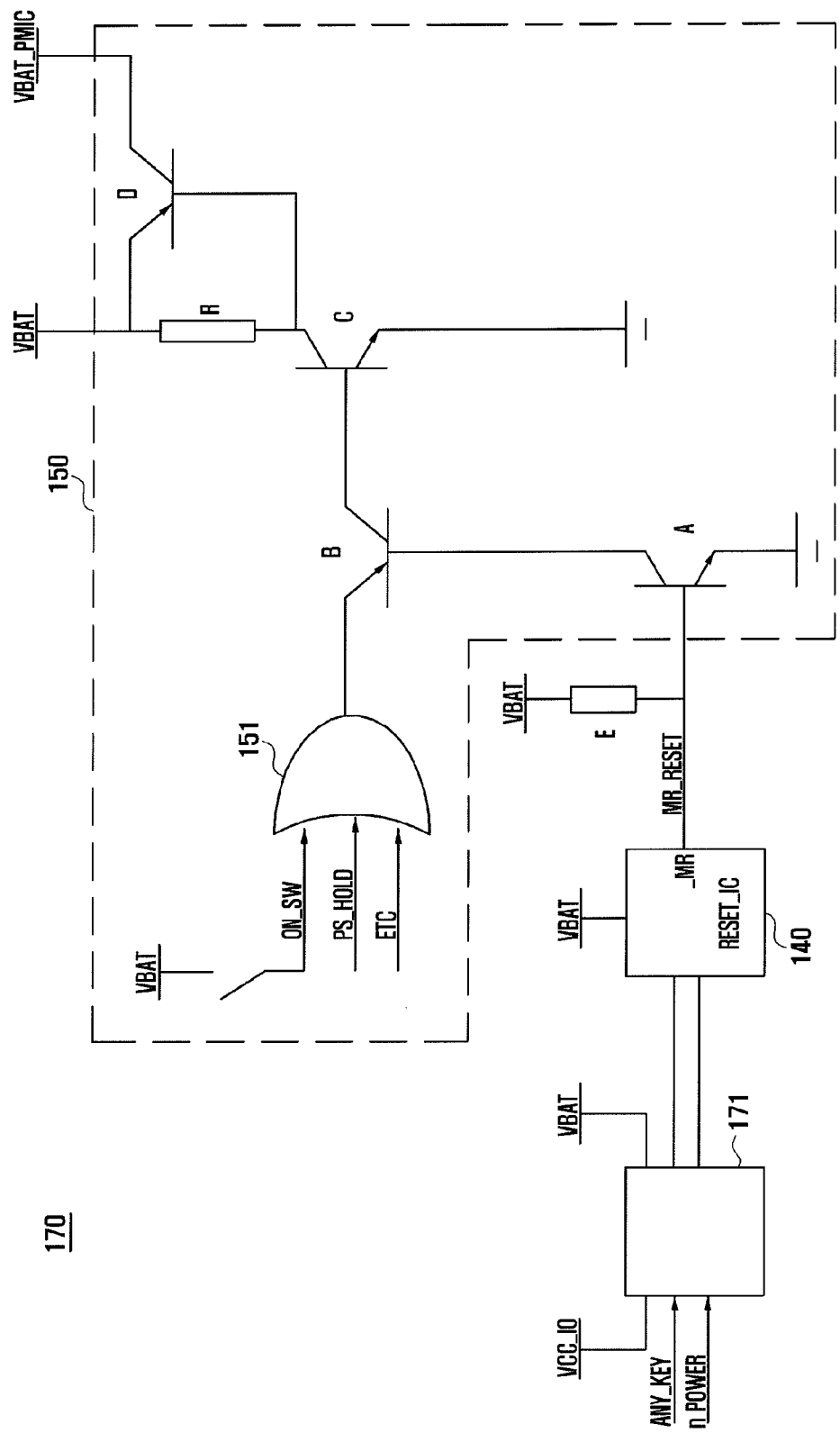
FIG. 3 is a circuit diagram illustrating a reset unit of a mobile device in accordance with a second exemplary embodiment of the present invention.

FIG. 3 is a circuit diagram illustrating a reset unit of a mobile device in accordance with a second exemplary embodiment of the present invention.

Referring to FIG. 3, the reset unit 170 according to the second exemplary embodiment of the present invention includes a level shifter 171 to which the power key input signal nPower and the specific key input signal ANY_KEY received from the input unit 110 are input, the reset circuit 140 that receives as an input the output of the level shifter 171, and the reset control circuit 150 to which the output of the reset circuit 140 is delivered. In addition, the reset unit 170 may further include the pull-up resistor E connected to the battery power VBAT and also connected in parallel to a signal line for delivering the output of the reset circuit 140 to the reset control circuit 150. Reset control circuit 150 in this exemplary embodiment is the same as described above. The level shifter 171 is configured to change a level from the input/output power VCC_IO to the battery power VBAT. And the reset circuit 140 may use the battery power VBAT as driving power. Therefore, the level shifter 171 may convert an input/output power VCC_IO level of two kinds of input signal, namely the power key input signal nPower and the specific key input signal ANY_KEY, into an input/output level of the reset circuit 140. When the power key input signal nPower and the specific key input signal ANY_KEY are received, the reset unit 170 having the above-discussed configurations changes an input/output level of such input signals to a battery power VBAT level by using the level shifter 171 and then delivers it to the reset circuit 140. The reset circuit 140 receives an input signal instructing a manual reset from the level shifter 171 and then may deliver the manual reset signal MR_RESET to the base of the first switch A. Here, the manual reset signal MR_RESET may be a low signal corresponding to a battery power level. The manual reset signal outputted from the reset circuit 140 is a low voltage and forces the first switch A to be in an inactivated state. Subsequently, by blocking the output of the OR gate 151 at the second switch B, inactivating the third switch C, and blocking the supply of the battery power VBAT at the fourth switch D, power supplied to the PMIC 130 is blocked.

However, in the above circuit configuration, a consumption current of the battery power VBAT by pull-up may be caused during operations of the mobile device 100 due to the pull-up resistor E and built-in resistance of the first switch A. In order to solve this problem, the following circuit configurations may be available.

Figure 4:
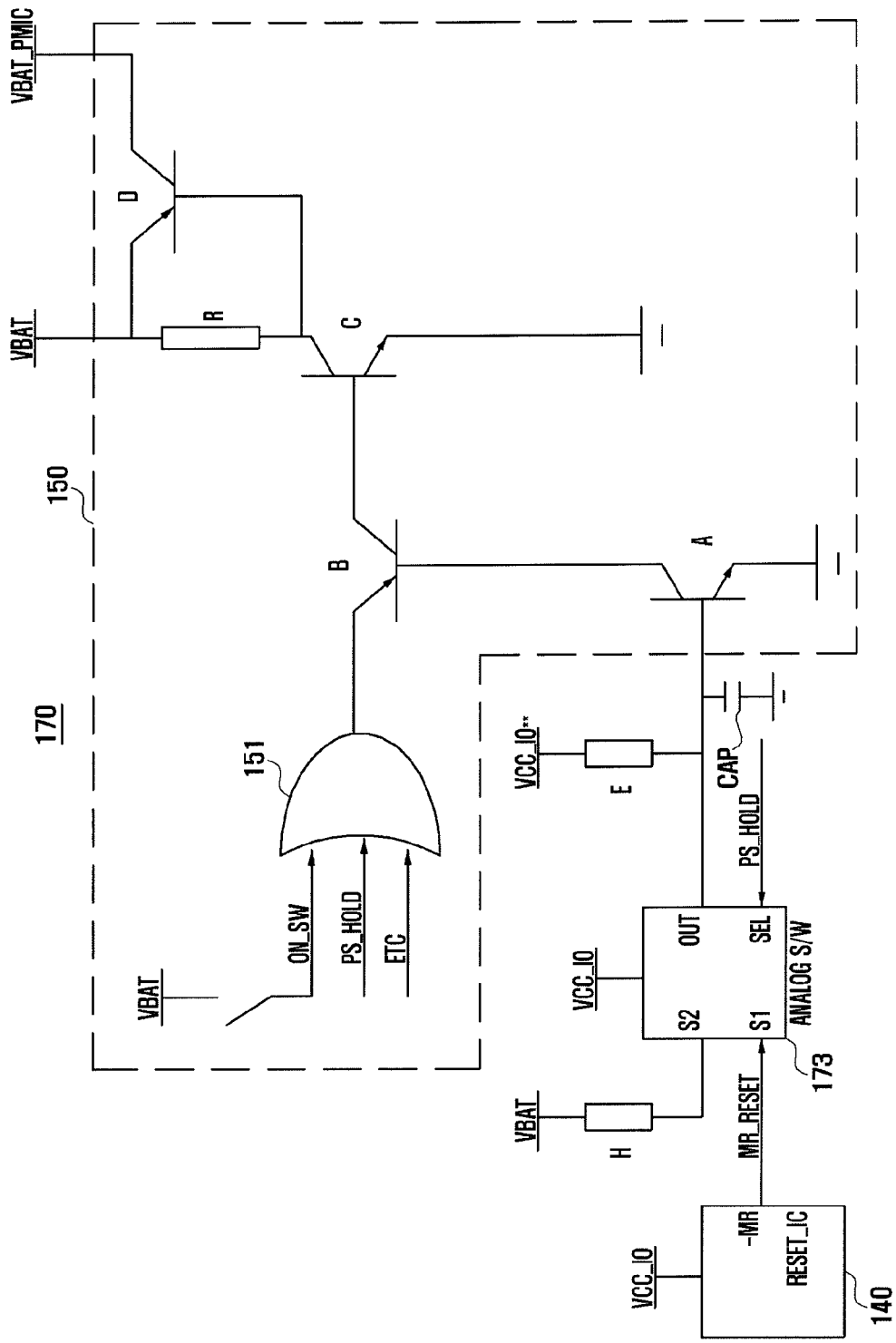
FIG. 4 is a circuit diagram illustrating a reset unit of a mobile device in accordance with a third exemplary embodiment of the present invention.

FIG. 4 is a circuit diagram illustrating a reset unit of a mobile device in accordance with a third exemplary embodiment of the present invention.

Referring to FIG. 4, the reset unit 170 according to the third exemplary embodiment of this invention may include the reset circuit 140, an analog switch 173 located at the output port of the reset circuit 140, and the reset control circuit 150 connected to the output port of the analog switch 173. Reset control circuit 150 in this exemplary embodiment is the same as described above. In addition, the pull-up resistor E connected to the input/output power VCC_IO, not VBAT as in the previous exemplary embodiments, may be connected in parallel between the analog switch 173 and the first switch A of the reset control circuit 150, and also a capacitor CAP may be connected in parallel between the analog switch 173 and the first switch A.

The reset unit 170 of this exemplary embodiment is driven by means of the input/output power VCC_IO. When the power key input signal nPower and the specific key input signal ANY_KEY are received, the reset circuit 140 may deliver the manual reset signal MR_RESET to the analog switch 173. The input/output power VCC_IO is a specific type of power the PMIC 130 creates using the battery power VBAT.

The analog switch 173 may have two selective input ports S1 and S2, one output port OUT, and one selection port SEL. Like the reset circuit 140, the analog switch 173 may be driven by means of the input/output power VCC_IO provided by the PMIC 130. The first selective input port S1 is connected to the output port of the reset circuit 140 and receives the manual reset signal MR_RESET from the reset circuit 140. The second selective input port S2 is connected to the battery power VBAT through a pull-up resistor H. The selection port SEL continuously receives the PS_HOLD signal with a logical high state while the mobile device 100 operates. If no input signal is input to the first selective input port S1, the analog switch 173 may output the battery power VBAT received at the second selective input port S2 to the reset control circuit 150 through the output port OUT. If the manual reset signal MR_RESET is input to the first selective input port S1, the analog switch 173 may output the manual reset signal MR_RESET to the first switch A of the reset control circuit 150 through the output port OUT. Here, the output port OUT of the analog switch 173 is connected to the base of the first switch A. In addition, the input/output power VCC_IO and the pull-up resistor E are connected in parallel between the output port OUT and the first switch A.

When the mobile device 100 does not operate, the PS_HOLD signal is in a logical low state. Therefore, if power is initially supplied or if power is supplied again after a reset, the analog switch 173 may deliver the battery power VBAT connected to the second selective input port S2 to the base of the first switch A to maintain a default logical high state. When power is supplied and thereby the PS_HOLD signal is changed to a logical high state, the output port OUT of the analog switch 173 supports a state capable of supplying the output of the first selective input port S1 to the first switch A. At this time, the reset circuit 140 does not yet create the manual reset signal and hence maintains a logical high state. Additionally, since the input/output power VCC_IO connected to the base of the first switch A is supplied through the pull-up resistor E, the first switch A may be in an activated state until the manual reset signal MR_RESET is delivered to the first selective input port S1. Here, the pull-up resistor E may perform a function to prevent an unexpected phenomenon to interrupt power due to what is called a "break-before-make" feature of the analog switch 173. More particularly, when the PS_HOLD signal is changed from a logical low state to a logical high state, a switching operation from the second selective input port S2 to the first selective input port S1 occurs. At this time, an electric current may be temporarily cut off at the output port OUT of the analog switch 173. This causes the first switch A to enter momentarily an off state, and also causes the PS_HOLD signal to be changed again to a logical low state. The pull-up resistor E prevents such repetition of turn-on and turn-off in the first switch A caused by a switching operation, so that the first switch A may be continuously in a turn-on state.

In an exemplary embodiment of the present invention, the input/output power VCC_IO supplied to the analog switch 173 may be formed of LDO power that is enabled in the initial turn-on process of the mobile device 100 and, in a sleep mode, is disabled with high impedance. The analog switch 173 may power down in a sleep mode through this configuration, thus further improving the generation of a consumption current at switch input/output ports.

The capacitor CAP may be connected in parallel between the output port OUT of the analog switch 173 and the base of the first switch A. While the battery power VBAT is supplied to the first switch A from the output port OUT of the analog switch 173, the capacitor CAP may charge from the battery power VBAT and then temporarily supply recharged power to the first switch A at a given time. Therefore, even without the addition of the pull-up resistor E, the capacitor CAP makes it possible to form a circuit regardless of the break-before-make feature of the analog switch 173. However, the capacitor CAP needs a design for maintaining stable characteristics of the mobile device 100 under various conditions in consideration of a power on-off characteristic of the mobile device 100, a reset timing, and a temperature characteristic of the first switch A and the capacitor CAP. Therefore, in a power on-off repeated situation, using the pull-up resistor E may be more effective. Consequently, the capacitor CAP may be omitted when there is the pull-up resistor E, and may replace the pull-up resistor E or be additionally used together with the pull-up resistor E in view of the stability of the mobile device 100.

As discussed heretofore, the reset unit 170 according to an exemplary embodiment of the present invention may minimize the generation of a consumption current by disposing the analog switch 173 between the reset circuit 140 and the reset control circuit 150 to selectively supply the manual reset signal MR_RESET and also by using the input/output power VCC_IO as driving power of the first switch A and as driving power of the analog switch 173.

Figure 5:
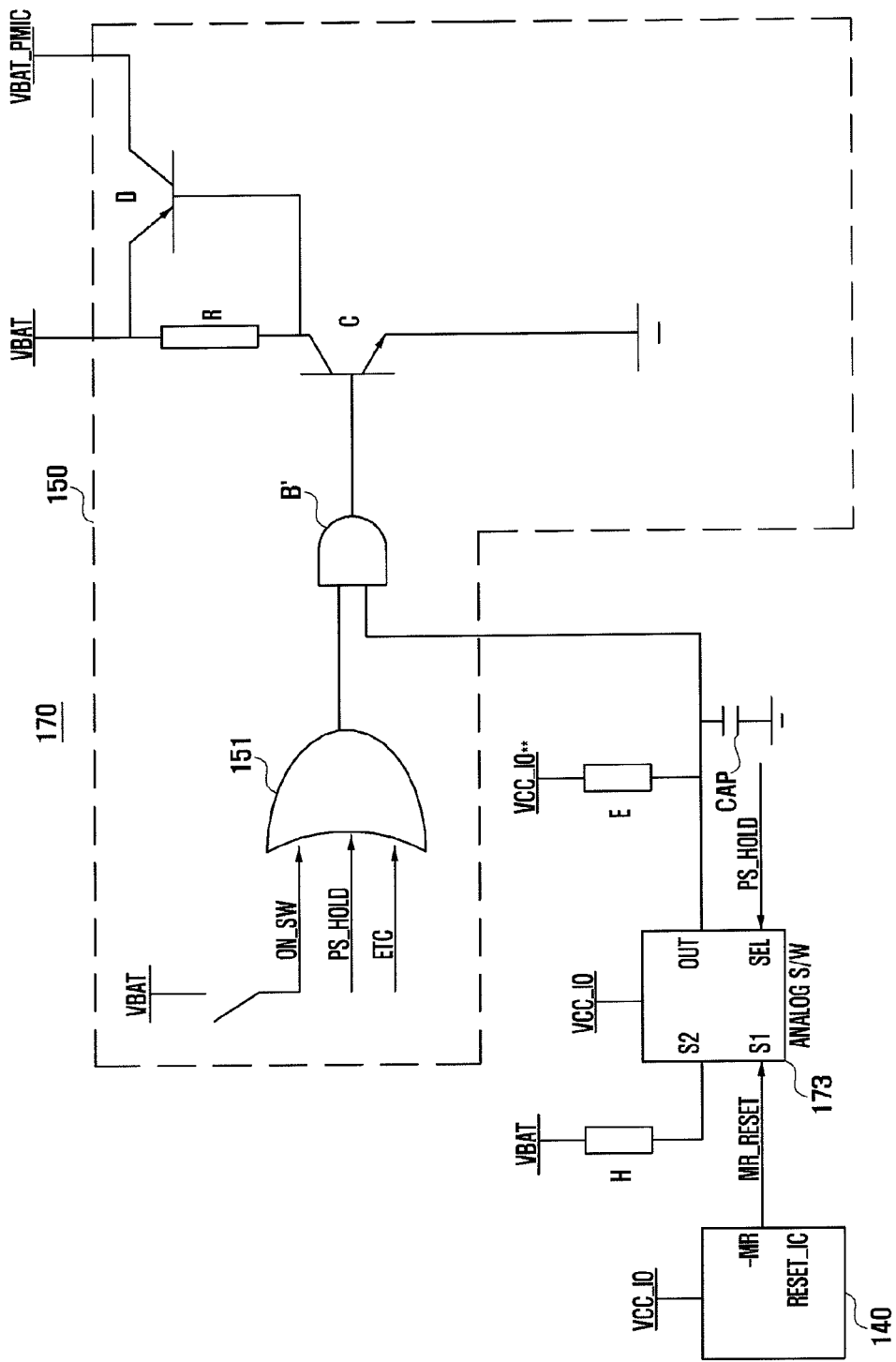
FIG. 5 is a circuit diagram illustrating a reset unit of a mobile device in accordance with a fourth exemplary embodiment of the present invention.

FIG. 5 is a circuit diagram illustrating a reset unit of a mobile device in accordance with a fourth exemplary embodiment of the present invention.

Referring to FIG. 5, the reset unit 170 according to the fourth exemplary embodiment of the present invention may include the reset circuit 140, the analog switch 173 located at the output port of the reset circuit 140, and the reset control circuit 150 connected to the output port of the analog switch 173. In addition, the pull-up resistor E, the input/output power VCC_IO, and the capacitor CAP may be disposed in the form of a parallel connection between the analog switch 173 and the reset control circuit 150.

More particularly, the reset control circuit 150 in this exemplary embodiment may include an AND gate B' to which the output of the OR gate 151 and the output of the analog switch 173 are input. The output of the AND gate B' is connected to the base of the third switch C, and the collector of the third switch C is connected to the battery power VBAT and the base of the fourth switch D.

In the reset unit 170 having the above-discussed configurations, the input/output power VCC_IO connected to the pull-up resistor E and a logical high signal of the reset circuit 140 may be supplied to the input port of the AND gate B' when no manual reset signal MR_RESET occurs in the reset circuit 140. Then the AND gate B' may receive the output of the OR gate 151 and thereby provide the output with a logical high state. Consequently, the third switch C may be in an activated state, and the fourth switch D may control the supply of the battery power VBAT to the PMIC 130.

Initially, when power is supplied to the mobile device 100, the analog switch 173 supplies the battery power VBAT to the AND gate B' through the output port OUT. Then, if the ON_SW signal for an initial power supply among inputs of the OR gate 151 is supplied, the AND gate B' may supply a logical high signal to the third switch C. Namely, the reset unit 170 allows the battery power VBAT to be supplied to the PMIC 130 when power is initially supplied to the mobile device 100.

Through a normal power supply, the PS_HOLD signal is in a high state at the selection port SEL of the analog switch 173. Here, the analog switch 173 may have a switching state connecting the first selective input port S1 and the output port OUT. In addition, the PMIC 130 may create the input/output power VCC_IO using the battery power VBAT and supply it to the AND gate B' through the pull-up resistor E. Since the PS_HOLD signal is supplied in a logical high state to the OR gate 151, the AND gate B' may supply a logical high signal to the third switch C in order to continuously supply the battery power VBAT to the PMIC 130.

In an exemplary embodiment of the present invention, if a user inputs a reset of the mobile device 100, namely if the power key input signal nPower and the specific key input signal ANY_KEY are supplied to the reset circuit 140 from the input unit 110, the reset circuit 140 provides the manual reset signal MR_RESET to the first selective input port S1 of the analog switch 173. Then the analog switch 173 delivers the manual reset signal MR_RESET with a logical low state to the input of the AND gate B'. The AND gate B' then supplies a low signal to the third switch C regardless of the output of the OR gate 151, so that the fourth switch D may perform a function to block the supply of the battery power VBAT to the PMIC 130. Therefore, the mobile device 100 may enter into a turn-off state.

Thereafter, when the PS_HOLD signal is in a logical low state, the analog switch 173 performs a switching operation connecting the second selective input port S2 and the output port OUT. Then the battery power VBAT may be supplied to the AND gate B' through the second selective input port S2 and the output port OUT of the analog switch 173. In an exemplary embodiment of the present invention, the non-inverse signal ON_SW of the power key input signal nPower is supplied to the OR gate 151. Also, when a specific counter in the mobile device 100 creates a count signal after reaching a predetermined count, the count signal may be supplied as an input, e.g., the ETC signal, of the OR gate 151. Therefore, the AND gate B' may supply a high signal to the third switch C by the OR gate 151 output with a logical high state and the output of the analog switch 173.

In an exemplary embodiment of the present invention, the AND gate B' may have a possibility of errors in treating various voltage inputs of the OR gate 151. Therefore, the AND gate B' may be designed in the form of a switch.

As discussed heretofore, using the reset circuit 140 and the reset control circuit 150, the mobile device 100 according to an exemplary embodiment of the present invention may perform a reset function of the mobile device 100 by blocking the supply of power for the PMIC 130 having no manual reset function.

In addition, the above-discussed reset control circuit 150 may generate a continuous consumption current. Related descriptions will be given below with reference to FIGS. 6 and 7.

Figure 6:
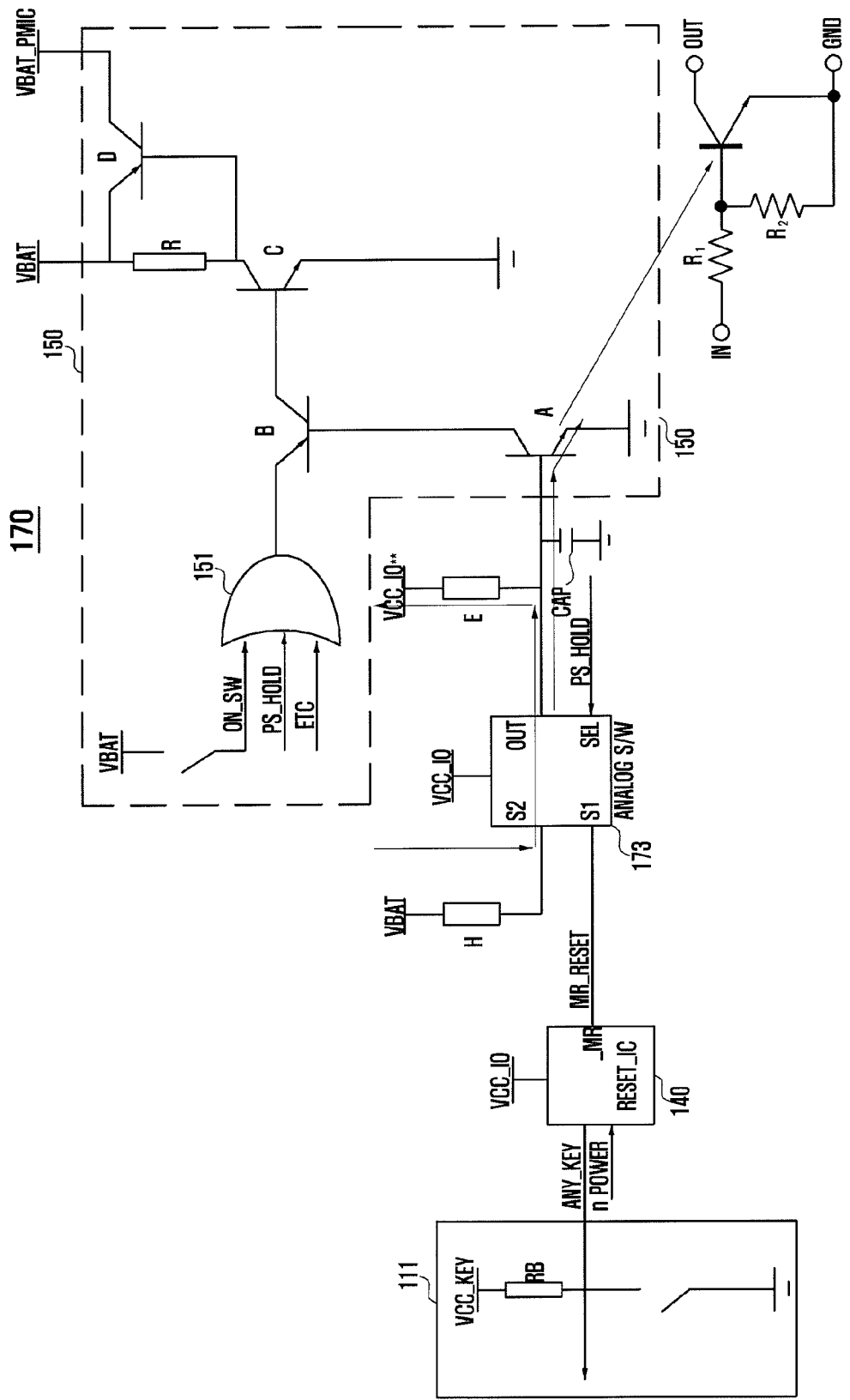
FIG. 6 is a circuit diagram illustrating a leakage current in a reset unit of a mobile device in accordance with an exemplary embodiment of the present invention.
Figure 7:
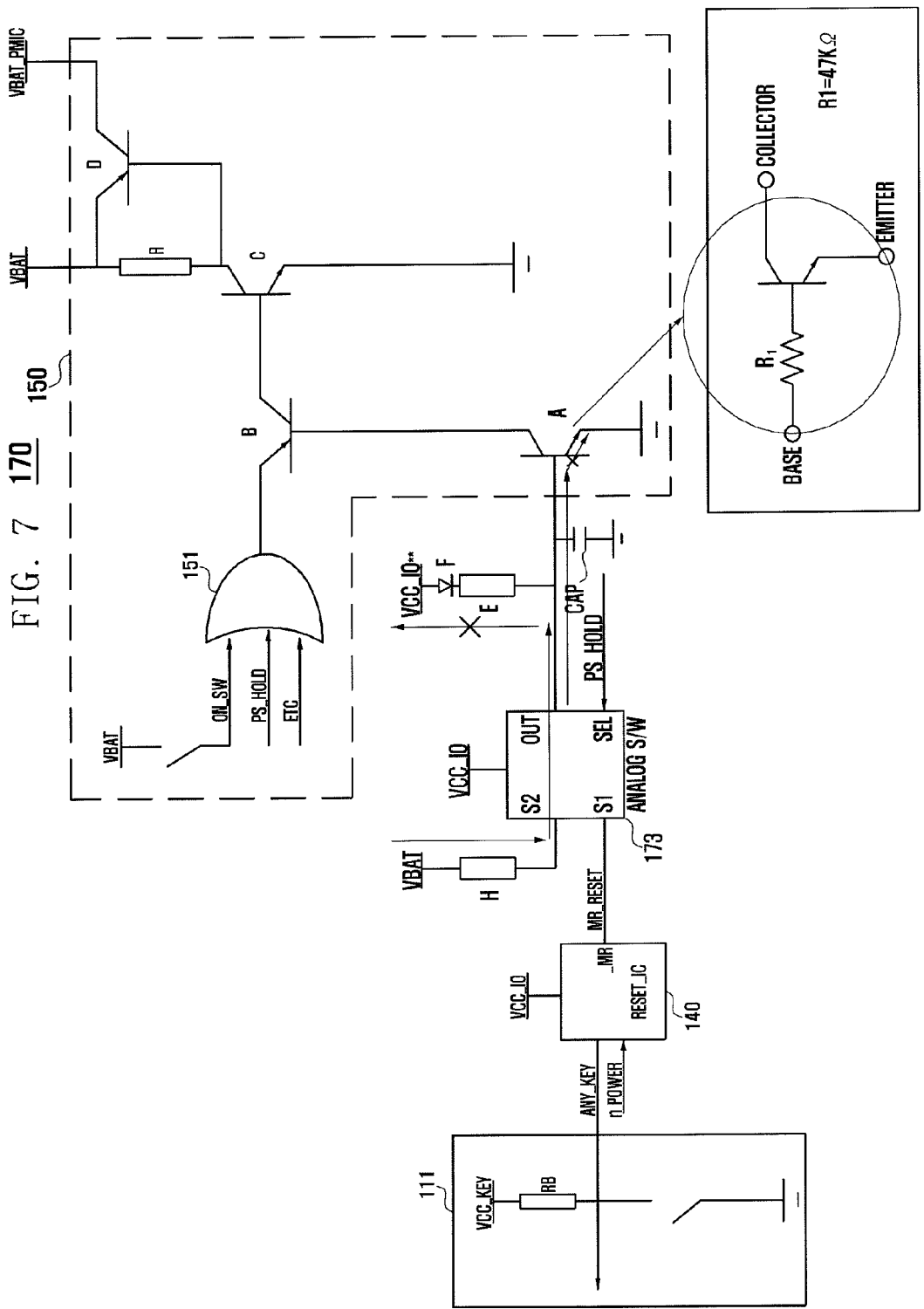
FIG. 7 is a circuit diagram illustrating a switch structure for preventing the occurrence of a leakage current in a reset unit of a mobile device in accordance with an exemplary embodiment of the present invention.

FIG. 6 is a circuit diagram illustrating a leakage current in a reset unit of a mobile device in accordance with an exemplary embodiment of the present invention, and FIG. 7 is a circuit diagram illustrating a switch structure for preventing a leakage current in a reset unit of a mobile device in accordance with an exemplary embodiment of the present invention.

Excepting circuit configurations for preventing a leakage current, the other circuit configurations shown in FIGS. 6 and 7 are substantially the same as those shown in FIG. 4. So, only parts related to a leakage current in the entire reset unit 170 will be described in detail hereinafter.

Referring to FIG. 6, the analog switch 173 delivers the battery power VBAT connected to the second selective input port S2 to the base of the first switch A to maintain a default logical high state. In an exemplary embodiment of the present invention, the battery power VBAT delivered to the first switch A through the pull-up resistor H may be designed to have a higher electric potential than the input/output power VCC_IO connected to the pull-up resistor E or such situations may occur. Therefore, a leakage current may be caused due to a potential difference between the battery power VBAT and the input/output power VCC_IO. Particularly, if an LDO supplying the input/output power VCC_IO provides an auto-discharge function for output when in a turn-off state or if there is no open circuit in view of internal circuitry, it may not be possible to define the output state of the LDO. In this case, a leakage current may occur due to a potential difference between the battery power VBAT and the input/output power VCC_IO. Namely, a leakage current may occur through a first path including the battery power VBAT, the pull-up resistor H, the analog switch 173 and the pull-up resistor E.

Additionally, as shown, the first switch A may have built-in resistors R1 and R2 therein. Therefore, the battery power VBAT output from the analog switch 173 may leak out toward the emitter of the first switch A through the built-in resistors R1 and R2 and the base of the first switch A. Namely, a leakage current may occur through a second path including the battery power VBAT, the pull-up resistor H, the analog switch 173, the base of the first switch A, the built-in resistors R1 and R2, and the emitter of the first switch A.

In order to prevent the occurrence of a leakage current, the reset unit 170 may have circuit configurations as shown in FIG. 7. Referring to FIG. 7, the reset unit 170 may include a diode F between the input/output power VCC_IO and the pull-up resistor E and thereby prevent the occurrence of a leakage current caused when the battery power VBAT flows backward through the first path in the direction of input/output power VCC_IO. In this reset unit 170, a reverse current of the diode F is about several hundred micro amperes, so that a leakage current in the direction of input/output power VCC_IO may be actually cut off.

Furthermore, as shown in FIG. 7, the reset unit 170 may use a switch type having no built-in resistor between the base and emitter of the first switch A, thus preventing the occurrence of a leakage current through the second path through the first switch A. Here, another built-in resistor R1 offered at the base of the first switch A may be removed or maintained.

As discussed above, the reset unit 170 according to an exemplary embodiment of the present invention may reduce unnecessary power consumption by preventing a leakage current of the battery power VBAT.

In an exemplary embodiment of the present invention, because of the use of a plurality of switches, the reset unit 170 may fail to perform a normal function due to such switches operating differently in a specific temperature condition when the device is changed from a turn-off state to a turn-on state or performs a reset function. Related descriptions will be given below with reference to FIGS. 8 to 12.

Figure 8:
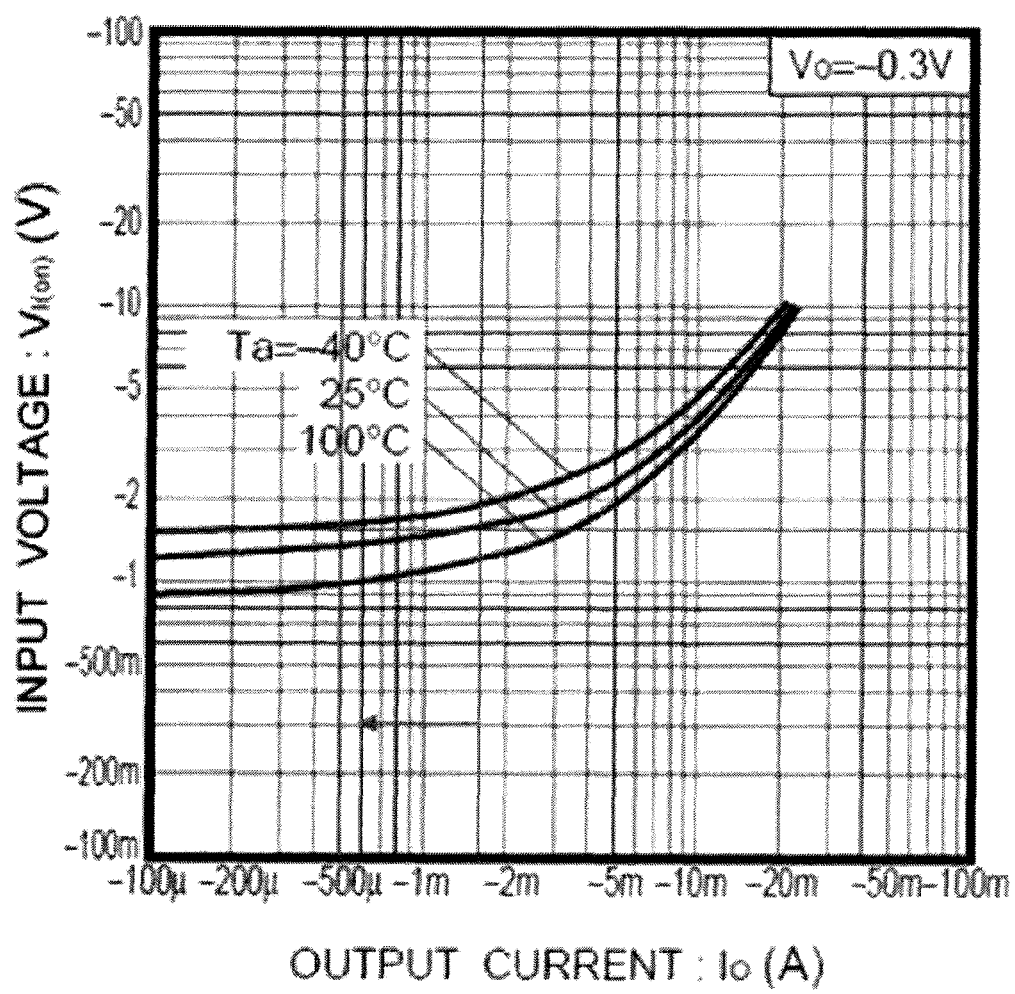
FIG. 8 is a graph illustrating electrical characteristic curves of input voltage vs. output current at different temperatures in accordance with an exemplary embodiment of the present invention.
Figure 9:
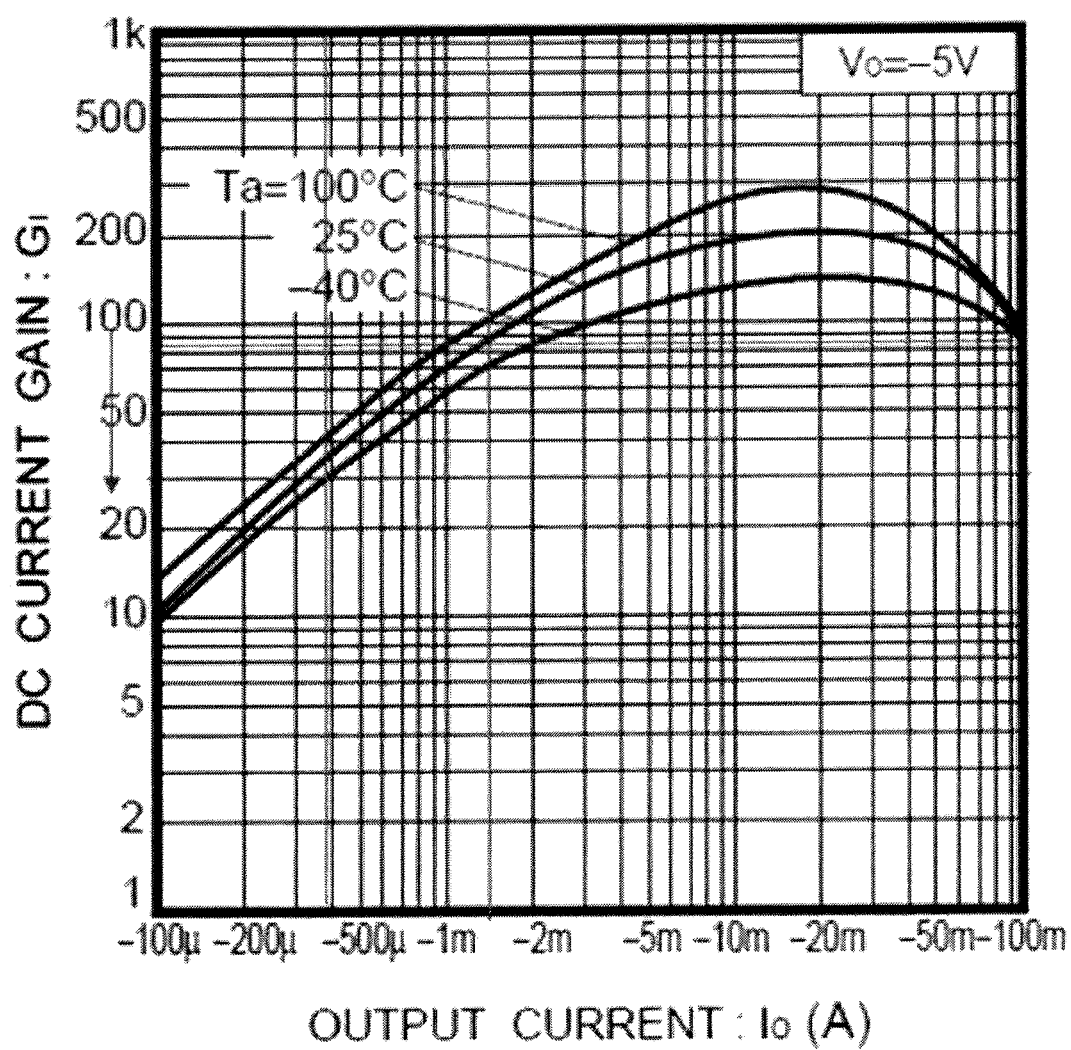
FIG. 9 is a graph illustrating electrical characteristic curves of Direct Current (DC) current gain vs. output current at different temperatures in accordance with an exemplary embodiment of the present invention.

FIG. 8 is a graph illustrating electrical characteristic curves of input voltage vs. output current at different temperatures in accordance with an exemplary embodiment of the present invention, and FIG. 9 is a graph illustrating electrical characteristic curves of DC current gain vs. output current at different temperatures in accordance with an exemplary embodiment of the present invention.

Referring to FIG. 8, when a temperature Ta drops from 25 degrees Celsius (C) to −40 degrees C., an output current of a switch is reduced by about 1 mA on a circuit operating point 1.5V. Additionally, referring to FIG. 9, a current gain of a switch relatively lowers at −40 degrees C. in comparison with 25 degrees C., and further, is much reduced while an output current is reduced about 1 mA.

Such variations of circuit characteristics according to temperature conditions are equally applied to each individual switch contained in a circuit of the reset unit 170. Therefore, at some temperature conditions, each switch of the reset unit 170 may sometimes not perform operations as intended by a designer. Related descriptions will be given below with reference to FIG. 10.

Figure 10:
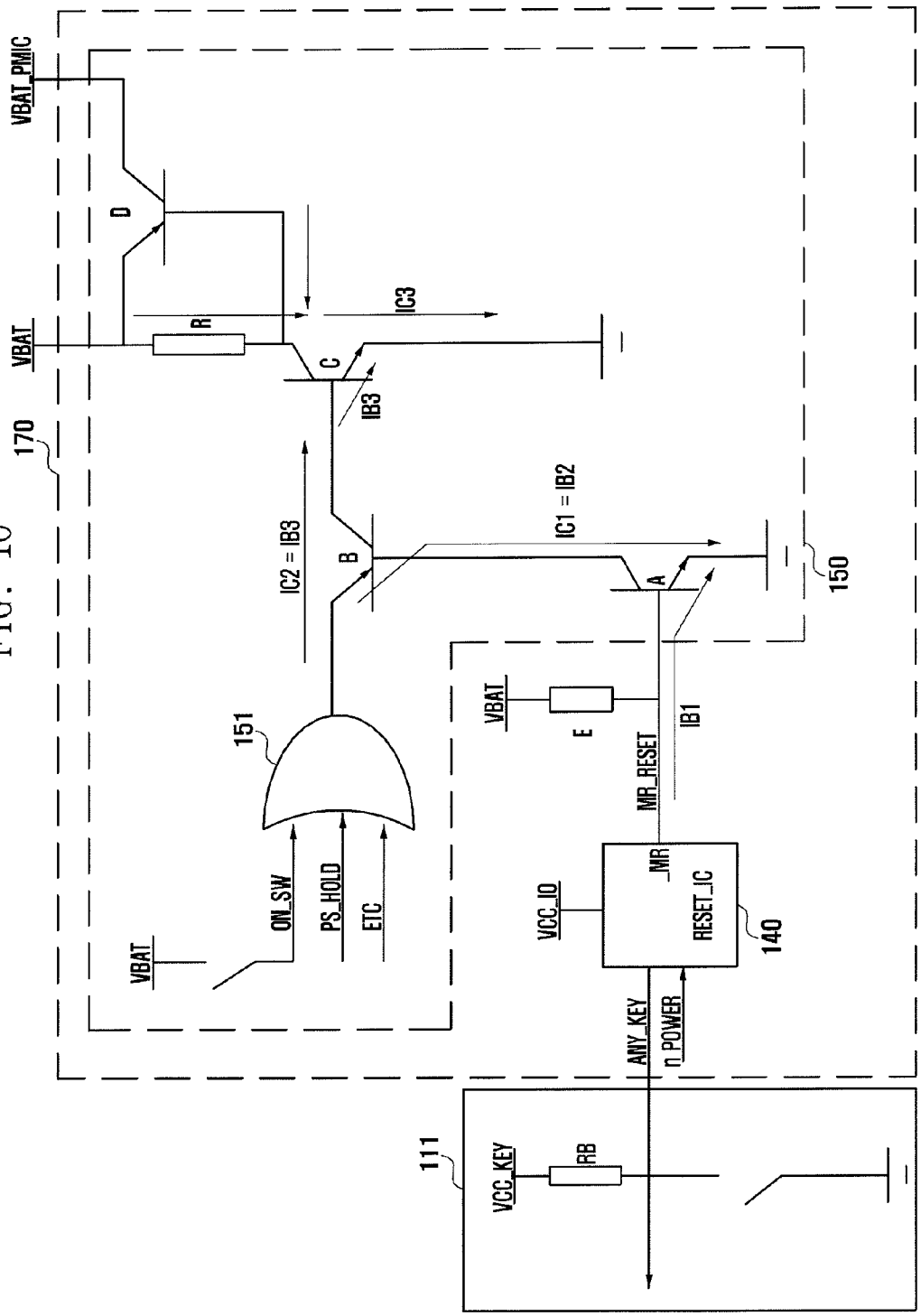
FIG. 10 is a circuit diagram illustrating current characteristics in a reset control circuit in accordance with an exemplary embodiment of the present invention.

FIG. 10 is a circuit diagram illustrating current characteristics in a reset control circuit in accordance with an exemplary embodiment of the present invention.

Referring to FIG. 10, in circuits of the reset unit 170, a collector current IC2 of the second switch B is equal to an output current IB3 flowing toward the base of the third switch C, and a collector current IC1 of the first switch A is equal to an output current IB2 flowing at the base of the second switch B. Therefore, when the IC1 current of the first switch A is reduced at a specific low temperature, e.g., −20 degrees C., the IB2 current and the IC1 current are reduced. The reduced IB2 current causes reductions in the IC2 current and the IB3 current. As a result, the IC3 current flowing at the third switch C is much reduced due to a reduction in the IB3 current. Conversely, when the IC3 current is reduced at a specific low temperature, the IB3 current may be reduced and thereby driving currents of the second and third switches B and C may also be reduced.

By the above-discussed negative feedback effect, the third switch C may not be driven due to the reduced IB3 current, or a voltage applied to the load resistor R may be reduced due to the reduced IC3 current. Unfortunately, this may result in a state that fails to satisfy a given driving voltage for the fourth switch D. If the mobile device 100 is left at a low temperature for some time, it is required to operate the fourth switch D connected to the collector of the third switch C so as to supply the battery power VBAT to the PMIC 130 according to a request for a turn-on or cold reset return process. However, a low temperature condition may disallow a normal circuit operation, and the battery power VBAT may not be supplied to the PMIC 130. As a result, the mobile device 100 may fail to be turned on or to return from a cold reset. In order to solve this problem, the reset unit 170 may have circuit configurations as shown in FIG. 11.

Figure 11:
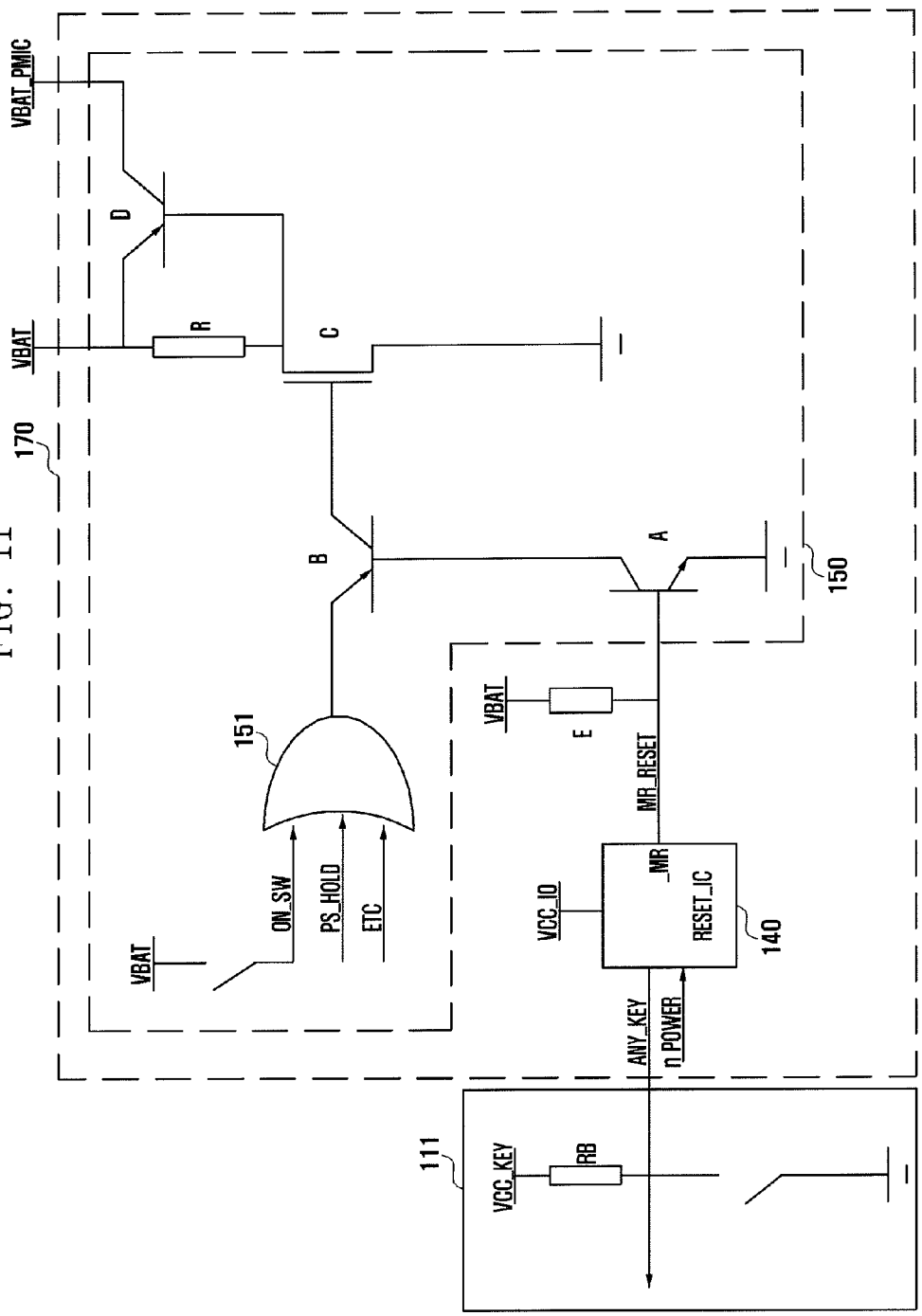
FIG. 11 is a circuit diagram illustrating a reset unit for supporting stable operations at specific temperature conditions in accordance with an exemplary embodiment of the present invention.

FIG. 11 is a circuit diagram illustrating a reset unit for supporting stable operations at specific temperature conditions in accordance with an exemplary embodiment of the present invention. Excepting some configurations, the reset unit 170 shown in FIG. 11 is mostly the same as that shown in FIG. 2. So, configurations except parts for supporting low temperature conditions will be omitted from the following descriptions.

Referring to FIG. 11, when a cold reset circuit for the PMIC 130 having no manual reset function is realized, the PMIC 130 is designed such that a connection state of the battery power VBAT is changed from a turn-off state to a turn-on state after a reset. If the mobile device 100 is in a low temperature condition, a transistor driving current of the third switch C may be lowered. So, the fourth switch D connected to the third switch C may fail to normally operate under constraints on the supply of an adequate driving current, and this may occasionally cause a failure in turning on the mobile device 100. Accordingly, possible solutions are to increase the IC3 current of the third switch C by increasing the IB3 current through regulations on the value of the pull-up resistor R, to use a voltage-driven type transistor instead of a current-driven type for the third switch C, or to use a small-signal transistor having no internal built-in resistor excluding the use of a digital transistor having an internal built-in resistor.

Specifically, as shown in FIG. 11, the reset unit 170 may be adjusted to increase the IB1 current of the first switch A by reducing a resistance value of the pull-up resistor E or any pull-up resistor connected to the base of the first switch A to a specific value or less. Therefore, the IC1 current of the first switch A is increased, and thereby the IB2 current of the second switch B is also increased. Additionally, as earlier discussed with regard to FIG. 10, the IC2 current of the second switch B, the IB3 current of the third switch C, and the IC3 current of the third switch C may be all increased. Consequently, the reset unit 170 satisfies a driving current value for driving the fourth switch D due to an increase in the IC3 current of the third switch C, and supports forming a path for supplying the battery power VBAT to the PMIC 130. A way to reduce pull-up resistance is as follows. First, current gains corresponding to output current decrease values of switches are detected in a particular low temperature condition. Next, current gains of output currents for driving the switches are detected at a normal temperature. Here, low temperature current gains of the first, second, and third switches A, B, and C are denoted as LB1, LB2, and LB3, respectively. Also, normal temperature current gains of the first, second, and third switches A, B, and C are denoted as HB1, HB2, and HB3, respectively. Then a pull-up resistance is divided by a factor corresponding to a relation among current gains, and a calculated pull-up resistance is used as a new pull-up resistance of the reset unit 170.

Namely, a new pull-up resistance may be defined as the following Equation 1.

Pull-up Resistance (1)×*LB*1×*LB*2×*LB*3/*HB*1×*HB*2×
  *HB*3=Pull-up Resistance (2)     Equation 1

Here, the pull-up resistance (1) means a pull-up resistance applied to the previously used reset unit 170, and the pull-up resistance (2) means a pull-up resistance to be applied to a low temperature condition. For example, according to an actual measurement in the previously used reset unit 170, a value of a normal temperature current gain divided by a low temperature current gain is about 2.83. Thus, considering that three switches are used, this value becomes about 22.66. It is therefore desirable that a pull-up resistance to be applied to a low temperature condition is designed to be about twenty-two times smaller than a pull-up resistance applied to a normal temperature condition. Namely, it is desirable that a normal temperature pull-up resistor with 1 kilo ohm is changed to a low temperature pull-up resistor with about 50 ohms in the reset unit 170 to be applied to a low temperature condition.

In an exemplary embodiment of the present invention, such a circuit variation may cause an increase of a consumption current due to a reduced pull-up resistance. In order to solve this problem, the third switch C may use a Field Effect Transistor (FET) of a voltage-driven type as shown in FIG. 11 instead of a Bipolar Junction Transistor (BJT) of a current-driven type.

In this case, the third switch C is hardly influenced by current variations of the first and second switches A and B. Therefore, even though the fourth switch D is not driven due to a decrease in the IB3 output current of the third switch C at a low temperature condition, it may be prevented that the battery power VBAT is not supplied to the PMIC 130. Such a change of the third switch C from a BJT type to an FET type may be equally applied to any other switches, i.e., the first, second, and fourth switches A, B, and D.

Figure 12:
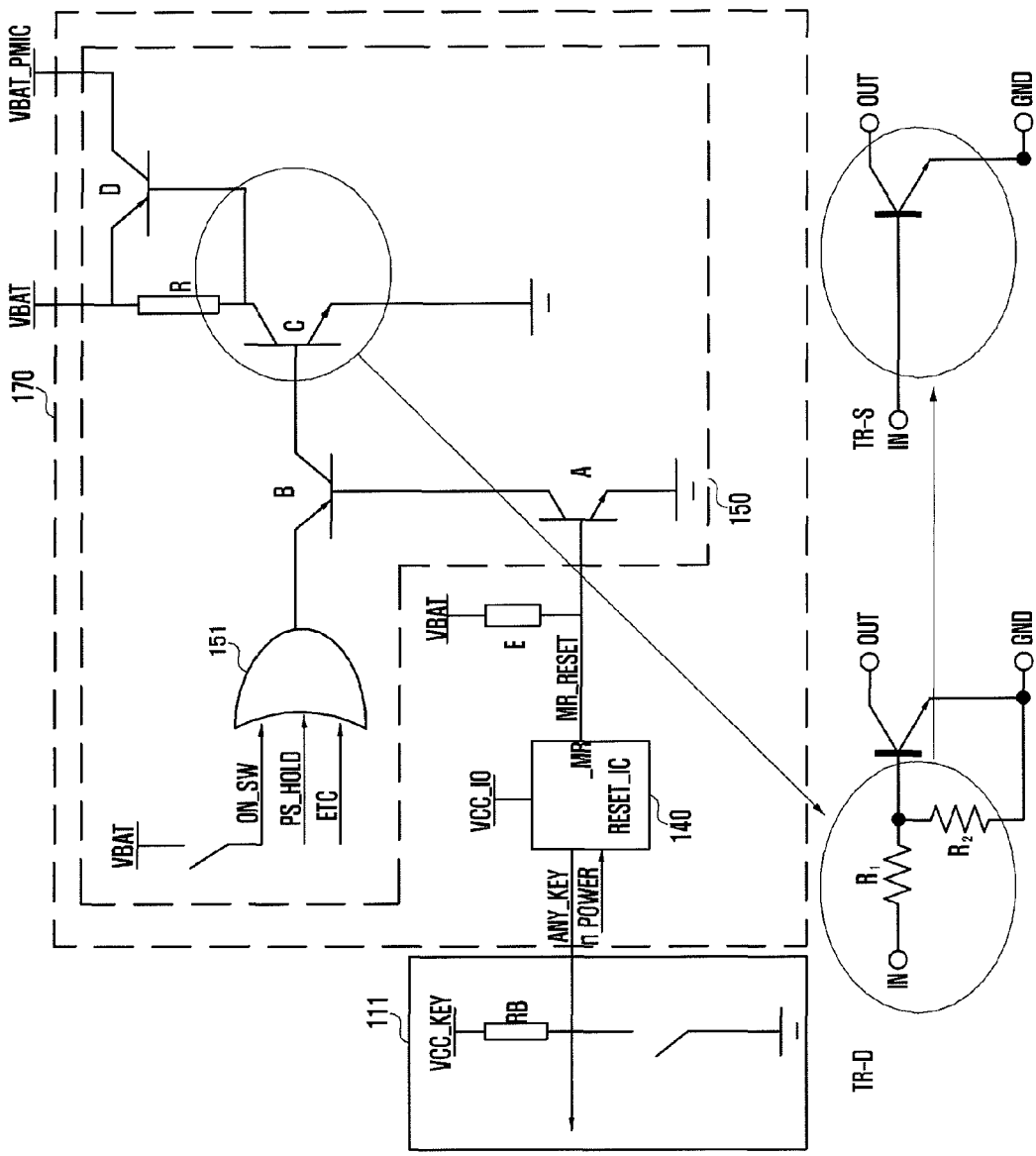
FIG. 12 is a circuit diagram illustrating a reset unit for supporting stable operations at specific temperature conditions in accordance with another exemplary embodiment of the present invention.

In an exemplary embodiment of the present invention, an FET type switch might be not cost-effective and large-sized in comparison with a BJT type switch. Therefore, not only to attain reductions in cost and size, but also to guarantee a stable operation in a low temperature condition, the mobile device 100 may employ configurations of the reset unit 170 as shown in FIG. 12.

As discussed above, the trouble of the mobile device 100 in a low temperature condition is that the battery power VBAT is not supplied to the PMIC 130 at a low temperature such as −20 degrees C. This is caused because the third switch C fails to normally drive the fourth switch D. Therefore, this problem may be solved by increasing the IB3 and IC3 currents of the third switch C. For this, characteristics of the previously used switches may be adjusted. Namely, if such switches are formed of digital transistors, internal built-in resistors having several ten kilo ohms are in parallel near the base and between the base and the emitter. Therefore, the reset unit 170 may employ a small-signal transistor having no internal built-in resistor excluding the use of a digital transistor having an internal built-in resistor. Then the reset unit 170 may be designed in a form of improving a problem that occasionally causes a turn-on failure in low temperature conditions. Referring to FIG. 12, as shown, if the third switch C is changed from a TR-D type digital transistor to a TR-S type small-signal transistor with no internal resistance, the IB3 current of the third switch C may be increased even in low temperature conditions and thereby the IC3 current for driving the fourth switch D may be also increased.

As discussed above, the mobile device 100 according to exemplary embodiments of the present invention may change a pull-up resistance value or switch types in realizing a cold reset circuit for the PMIC having no manual reset function, thus preventing abnormal operations of the device that may occur in low temperature conditions.

The above-discussed mobile device 100 may essentially or selectively include any other elements. For instance, the mobile device 100 may further include a short range communication module, a digital camera module, a wired or wireless data transmission interface, an Internet access module, a digital broadcast receiving module, and so forth. According to a digital convergence tendency today, such elements may be varied, modified and improved in various ways, and any other elements equivalent to the above elements may be additionally or alternatively equipped in the mobile device 100. Meanwhile, as will be understood by those skilled in the art, some of the above-mentioned elements in the mobile device 100 may be omitted or replaced with another.

Additionally, the mobile device 100 of this invention may include any types of electronic devices that include a Wireless Fidelity (WiFi) module. For instance, the mobile device 100 may include communication devices, multimedia players, and their application equipment, especially including many mobile communication terminals based on various communication protocols, a Portable Multimedia Player (PMP), a digital broadcasting player, a Personal Digital Assistant (PDA), a music player (e.g., a Motion Picture Experts Group (MPEG)-2 Audio Layer III (MP3) player), a portable game console, a smart phone, a notebook, a handheld personal computer, etc.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for resetting a mobile device comprising a Power Management Integrated Circuit (PMIC) with no manual reset function, the apparatus comprising:
 an input unit configured to create a specific input signal for a reset according to a user's input;
 a reset unit configured to create a manual reset input signal in response to the specific input signal, and to block battery power supplied to the PMIC by using the manual reset input signal and a signal created during operations of the mobile device; and
 a power unit configured to supply the battery power.

2. The apparatus of claim 1, wherein the reset unit includes:
 a reset circuit configured to create the manual reset input signal in response to the specific input signal; and
 a reset control circuit configured to block the battery power to the PMIC in response to both the manual reset input signal and the specific input signal.

3. The apparatus of claim 2, wherein the reset control circuit comprises:
 a first switch activated according to an output of the reset circuit;
 a second switch activated according to the activation of the first switch;
 an OR gate configured to output a signal through the second switch;
 a third switch activated according to an output of the OR gate; and a fourth switch configured to supply or block the battery power to the PMIC according to the activation of the third switch.

4. The apparatus of claim 3, wherein the first switch and the second switch comprise an AND gate, and the reset control circuit activates the third switch according to the output of the reset circuit and the output of the OR gate.

5. The apparatus of claim 3, wherein the OR gate delivers a signal for activating the third switch to the third switch through the second switch when receiving at least one of an input signal having a logical high state during operation of the mobile device, an input signal received from the input unit to instruct power supply of the mobile device, and any other signal corresponding to at least one of an insertion of a charger, an insertion of a Universal Serial Bus (USB) jig, and an input of a count.

6. The apparatus of claim 3, wherein the first switch is devoid of a built-in resistor between a base and an emitter thereof, and the third switch is devoid of a built-in resistor connected to a base thereof and between the base and an emitter thereof.

7. The apparatus of claim 2, wherein the reset unit further includes:
a pull-up resistor disposed between the reset circuit and the reset control circuit, and
wherein battery power or input/output power provided by the PMIC is connected to one end of the pull-up resistor and then provides a default logical high signal to a predetermined switch contained in the reset control circuit.

8. The apparatus of claim 7, wherein the reset circuit is driven by the battery power or the input/output power provided by the PMIC.

9. The apparatus of claim 7, wherein the reset unit further includes:
a level shifter located at a front end of the reset circuit and configured to change a power level of the specific input signal to a level of the battery power, the specific input signal being for the reset and received from the input unit.

10. The apparatus of claim 2, wherein the reset unit further includes at least one of:
an analog switch disposed between the reset circuit and the reset control circuit; and
at least one of a pull-up resistor connected to input/output power provided by the PMIC and disposed between the reset circuit and the reset control circuit, and a capacitor disposed between the reset circuit and the reset control circuit.

11. The apparatus of claim 10, wherein the analog switch comprises:
a first selective input port connected to an output port of the reset circuit;
a second selective input port connected to a pull-up resistor to which the battery power is connected;
a selection port configured to receive a signal with a logical high state when the mobile device operates, and to receive a signal with a logical low state when the mobile device stops operating; and
an output port configured to receive a signal from the first selective input port or the second selective input port according to a state of the signal input to the selection port, and to supply the received signal to the reset control circuit.

12. The apparatus of claim 10, wherein the analog switch is driven by input/output power provided by the PMIC.

13. The apparatus of claim 10, wherein the reset unit further includes:

a diode disposed between the input/output power and the pull-up resistor.

14. A method of resetting a mobile device comprising a Power Management Integrated Circuit (PMIC) with no manual reset function, the method comprising:
creating a manual reset input signal at a reset circuit in response to a specific input signal for a reset of the mobile device and then supplying the manual reset input signal to a reset control circuit; and
controlling a state for supplying or blocking of battery power to the PMIC on a basis of the reset control circuit receiving the manual reset input signal when the specific input signal and a signal created during operations of the mobile device occur.

15. The method of claim 14, further comprising:
before the creating of the manual reset input signal,
activating a switch for supplying the battery power to the PMIC by using one of a pull-up of the battery power and a pull-up of input/output power provided using the battery power by the PMIC; and
controlling a supply of the battery power to the PMIC according to the activation of the switch.

16. The method of claim 15, further comprising one of:
supplying the battery power to the reset circuit to drive the reset circuit; and
supplying the input/output power provided by the PMIC to the reset circuit to drive the reset circuit.

17. The method of claim 14, wherein the controlling of the state includes:
when an analog switch driven by input/output power provided using the battery power by the PMIC is disposed between the reset circuit and the reset control circuit, supplying a pull-up of the battery power to the reset control circuit through the analog switch on a basis of a signal supplied in a logical high state during operations of the mobile device; and
controlling a supply of the battery power to the PMIC on a basis of the signal supplied in a logical high state and the pull-up of the battery power.

18. The method of claim 17, wherein the controlling of the state further includes:
supplying the manual reset input signal in a logical low state to the reset control circuit through the analog switch in response to the specific input signal for the reset; and
blocking a path for supplying the battery power to the PMIC by inactivating switches in the reset control circuit in response to the manual reset input signal.

19. The method of claim 18, further comprising at least one of:
supplying input/output power to a pull-up between the analog switch and the reset control circuit, the input/output power being provided using the battery power by the PMIC; and
when a capacitor is disposed on a path for supplying a pull-up of the battery power to the reset control circuit, temporarily storing a charge of the battery power in the capacitor and then supplying the stored charge when the battery power is cut off.

20. The method of claim 14, further comprising at least one of:
supplying an output of a counter to the reset control circuit by driving the counter after blocking a power supply to the PMIC, supplying a pull-up of the battery power to the reset control circuit, and resuming the power supply to the PMIC by using both the output of the counter and the pull-up of the battery power when a power key input signal is supplied to the reset control circuit; and supplying the battery power as driving power of the reset circuit when the pull-up of the battery power is supplied between the reset circuit and the reset control circuit, and shifting a level of the specific input signal to a level of the battery power.

\* \* \* \* \*